United States Patent
Hoentschel et al.

(10) Patent No.: US 7,863,171 B2
(45) Date of Patent: Jan. 4, 2011

(54) SOI TRANSISTOR HAVING A REDUCED BODY POTENTIAL AND A METHOD OF FORMING THE SAME

(75) Inventors: Jan Hoentschel, Sachsen (DE); Andy Wei, Dresden (DE); Joe Bloomquist, Dresden (DE); Manfred Horstmann, Duerroehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 962 days.

(21) Appl. No.: 11/609,995

(22) Filed: Dec. 13, 2006

(65) Prior Publication Data

US 2007/0252205 A1 Nov. 1, 2007

(30) Foreign Application Priority Data

Apr. 28, 2006 (DE) .................. 10 2006 019 935

(51) Int. Cl.
*H01L 21/00* (2006.01)
(52) U.S. Cl. .................. 438/528; 438/276; 438/289
(58) Field of Classification Search .......... 438/528, 438/276, 289
See application file for complete search history.

(56) References Cited

U.S. PATENT DOCUMENTS

| | | | | |
|---|---|---|---|---|
| 4,391,651 | A | 7/1983 | Yoder | 148/1.5 |
| 5,960,268 | A * | 9/1999 | Aihara | 438/166 |
| 5,986,311 | A * | 11/1999 | Aihara | 257/382 |
| 6,225,176 | B1 | 5/2001 | Yu | 438/305 |
| 6,548,361 | B1 | 4/2003 | En et al. | 438/301 |
| 6,682,980 | B2 * | 1/2004 | Chidambaram et al. | 438/302 |
| 6,713,819 | B1 | 3/2004 | En et al. | 257/369 |
| 7,157,355 | B2 * | 1/2007 | Goktepeli | 438/486 |
| 7,169,675 | B2 * | 1/2007 | Tan et al. | 438/301 |
| 7,279,758 | B1 * | 10/2007 | Li et al. | 257/408 |
| 7,416,605 | B2 * | 8/2008 | Zollner et al. | 117/89 |
| 7,473,608 | B2 * | 1/2009 | Li et al. | 438/303 |
| 7,582,547 | B2 * | 9/2009 | Pawlak | 438/528 |
| 2002/0033511 | A1 | 3/2002 | Babcock et al. | 257/408 |
| 2002/0058361 | A1 | 5/2002 | Nakaoka et al. | 438/149 |

(Continued)

FOREIGN PATENT DOCUMENTS

DE 10025217 2/2001

(Continued)

OTHER PUBLICATIONS

PCT Search Report Dated Sep. 4, 2007 for serial No. PCT/US07/007559.

(Continued)

*Primary Examiner*—Laura M Menz
(74) *Attorney, Agent, or Firm*—Williams, Morgan & Amerson, P.C.

(57) ABSTRACT

By introducing a atomic species, such as carbon, fluorine and the like, into the drain and source regions, as well as in the body region, the junction leakage of SOI transistors may be significantly increased, thereby providing an enhanced leakage path for accumulated minority charge carriers. Consequently, fluctuations of the body potential may be significantly reduced, thereby improving the overall performance of advanced SOI devices. In particular embodiments, the mechanism may be selectively applied to threshold voltage sensitive device areas, such as static RAM areas.

7 Claims, 5 Drawing Sheets

U.S. PATENT DOCUMENTS

| | | | |
|---|---|---|---|
| 2002/0187612 A1 | 12/2002 | Sleight et al. | 438/373 |
| 2003/0027381 A1 | 2/2003 | Buynoski et al. | 438/162 |
| 2003/0096490 A1 | 5/2003 | Borland et al. | 438/513 |
| 2003/0162336 A1 | 8/2003 | Wei et al. | 438/166 |
| 2003/0207542 A1* | 11/2003 | Chidambaram et al. | 438/305 |
| 2005/0151172 A1 | 7/2005 | Takemura et al. | 257/288 |
| 2006/0003561 A1* | 1/2006 | Goktepeli | 438/528 |
| 2006/0006427 A1* | 1/2006 | Tan et al. | 257/227 |
| 2007/0148888 A1* | 6/2007 | Krull et al. | 438/306 |
| 2007/0252205 A1* | 11/2007 | Hoentschel et al. | 257/347 |
| 2007/0281413 A1* | 12/2007 | Li et al. | 438/201 |
| 2008/0020591 A1* | 1/2008 | Balseanu et al. | 438/761 |
| 2008/0108208 A1* | 5/2008 | Arevalo et al. | 438/514 |
| 2008/0191243 A1* | 8/2008 | Liu et al. | 257/190 |
| 2009/0042353 A1* | 2/2009 | Ma et al. | 438/308 |
| 2009/0042354 A1* | 2/2009 | Ma et al. | 438/308 |
| 2009/0042359 A1* | 2/2009 | Lindsay et al. | 438/433 |
| 2009/0042376 A1* | 2/2009 | Ma et al. | 438/524 |
| 2009/0057678 A1* | 3/2009 | Goldbach et al. | 257/66 |
| 2009/0179280 A1* | 7/2009 | Kohli et al. | 257/408 |
| 2009/0286367 A1* | 11/2009 | Krull et al. | 438/221 |

FOREIGN PATENT DOCUMENTS

| | | |
|---|---|---|
| EP | 0419128 | 3/1991 |
| EP | 1577932 | 9/2005 |
| WO | 01/22500 | 3/2001 |

OTHER PUBLICATIONS

Translated German office action dated March 14, 2007.

* cited by examiner

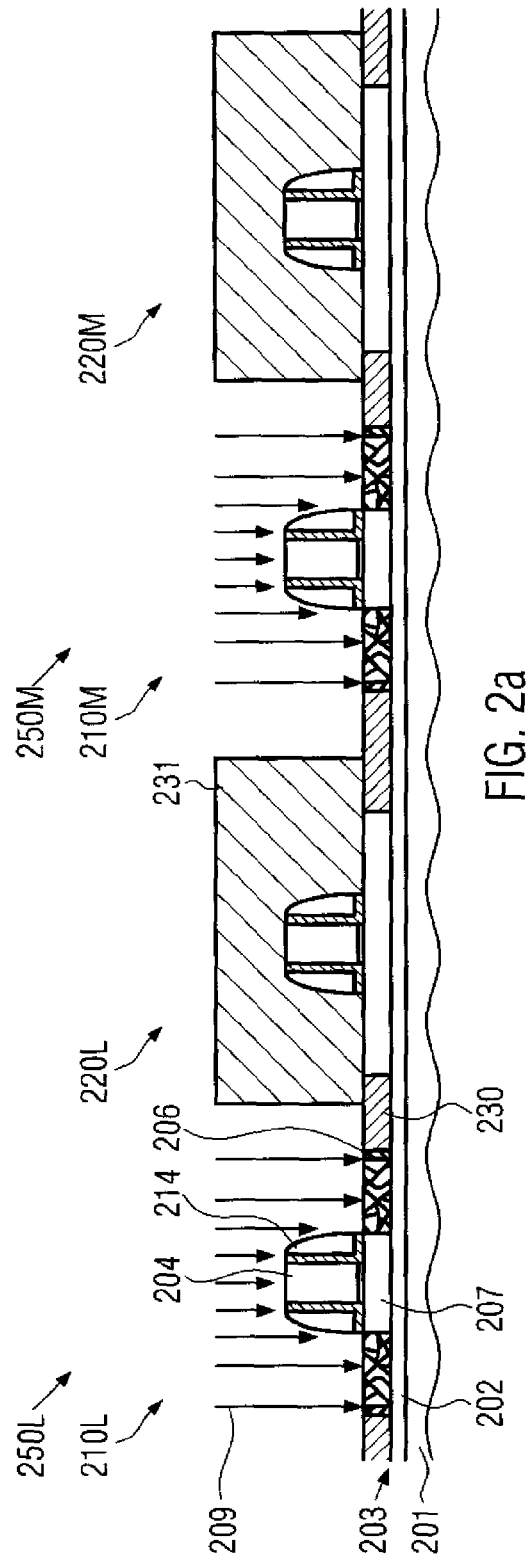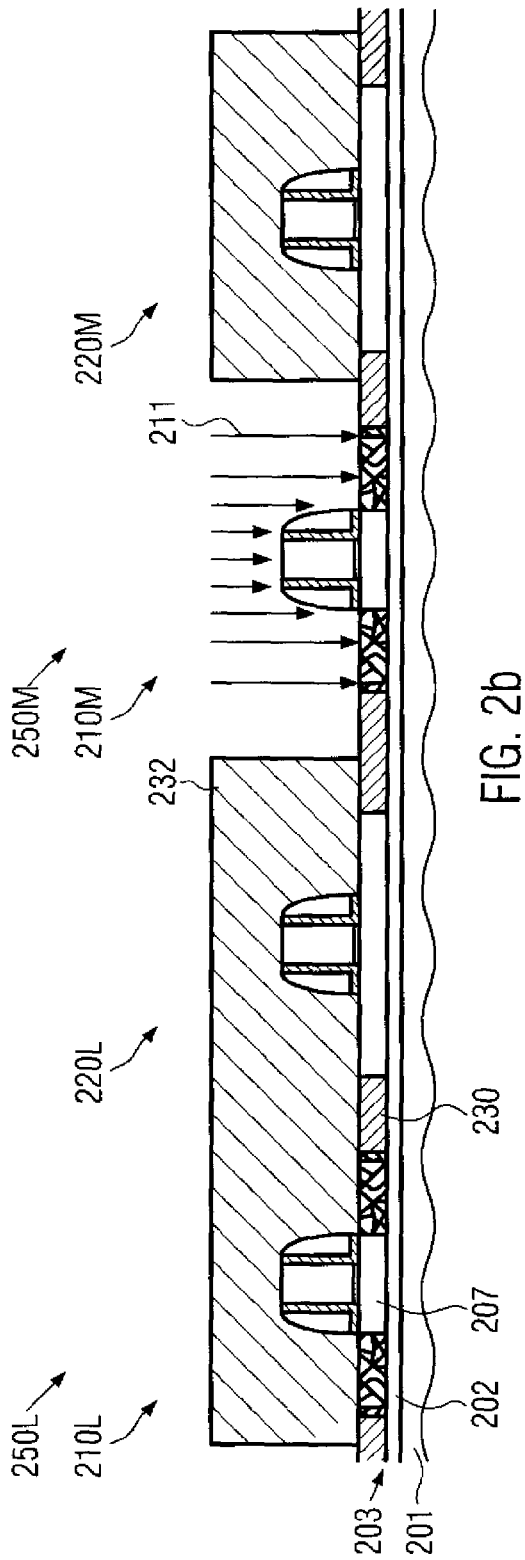

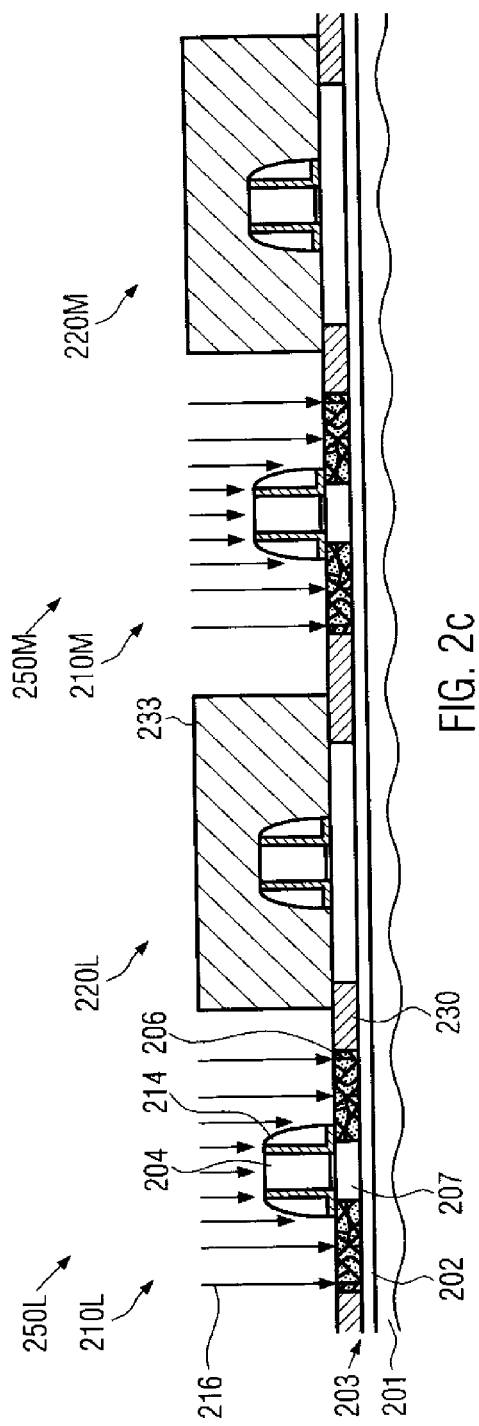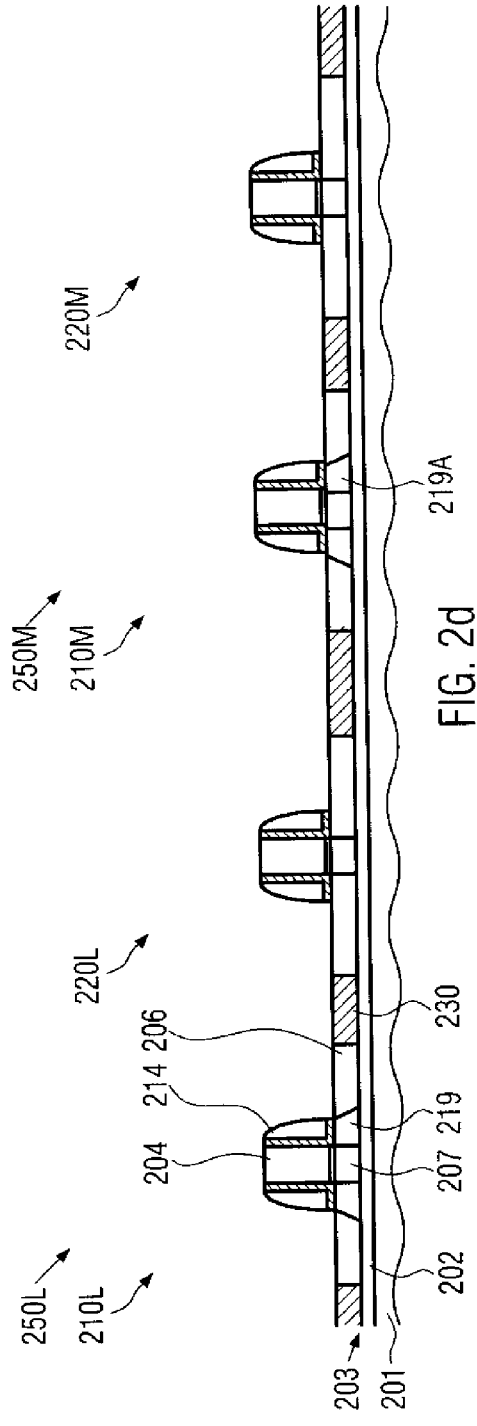

SOI TRANSISTOR HAVING A REDUCED BODY POTENTIAL AND A METHOD OF FORMING THE SAME

BACKGROUND OF THE INVENTION

1. Field of the Invention

Generally, the present invention relates to the formation of integrated circuits, and, more particularly, to field effect transistors in complex circuits which may include a high speed logic circuitry and functional blocks with less speed critical behavior, such as a memory area, formed according to silicon-on-insulator (SOI) architecture.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips, ASICs (application specific ICs) and the like, CMOS technology is currently one of the most promising approaches, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the latter aspect renders the reduction of the channel length, and associated therewith the reduction of the channel resistivity, a dominant design criterion for accomplishing an increase in the operating speed of the integrated circuits.

In view of the former aspect, in addition to other advantages, SOI architecture has continuously been gaining in importance for manufacturing MOS transistors, due to the characteristics of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. This configuration provides significant advantages, but also gives rise to a plurality of issues. Contrary to the body of bulk devices, which is electrically connected to the substrate and thus applying a specified potential, the substrate maintains the bodies of bulk transistors at a specified potential, the body of SOI transistors is not connected to a specified reference potential, and hence, the body's potential may usually float due to accumulating minority charge carriers, thereby leading to a variation of the threshold voltage (Vt) of the transistors depending on the "switching history" of the transistor, which may also be referred to as hysteresis. In particular, for static memory cells, the operation dependent threshold variation may result in significant instabilities of the cell, which may not be tolerable in view of data integrity of the memory cell. Consequently, in conventional SOI devices including memory blocks, the drive current fluctuations associated with the threshold voltage variations are taken into consideration by appropriate design measures in order to provide a sufficiently high drive current range of the SOI transistors in the memory block. Hence, the respective SOI transistors in the memory block are typically formed with a sufficiently large width to provide the required drive current margins, thereby requiring a moderately high amount of chip area. Similarly, other design measures for eliminating threshold fluctuations caused by the floating body potential, for instance so-called body ties, are a very space-consuming solution and may not be desirable for highly scaled and complex semiconductor devices including extended RAM areas.

Thus, in other SOI manufacturing processes, the charge accumulation is reduced by increasing the leakage of the drain and source junctions to allow discharge of the accumulated charge carriers at least to a certain degree. The increased leakage of the PN junctions may be achieved by specifically engineering the junctions to exhibit an increased diode current for the drain/source-body diodes to discharge sufficient charge carriers to maintain the body potential and thus threshold voltage variations within predefined tolerances. For this purpose, a so called pre-amorphization implantation is frequently used to substantially amorphize the drain and source regions and to re-crystallize the drain and source regions, which may then result in dislocation defects in the body region and the drain and source regions, thereby providing leakage paths for charge carriers. Although this type of junction engineering may provide SOI transistors with reduced body potential fluctuations without relying on other techniques, such as body ties and the like, a certain degradation of performance may be observed for high speed transistors due to a certain influence on the lateral and vertical dopant profile. Moreover, for SOI transistors in memory cells, a significant variation of the threshold voltage may still be observed, which may result in reduced write stability and thus decreased reliability and yield.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for reducing hysteresis effects in advanced SOI transistors, wherein a high degree of compatibility with existing technologies may be maintained, while additionally an effective mechanism is provided for discharging unwanted charge carriers from the body region of the SOI transistors. For this purpose, an appropriate atomic species may be incorporated into the drain and source regions and partially into the body region in order to provide increased leakage currents of the respective PN junctions while maintaining an influence on the overall vertical and lateral dopant profile at a low level. Without intending to restrict the present invention to the following explanation, it is believed that, by incorporation of an appropriate, non-doping atomic species, effective charge carrier traps may be implemented in the band gap of the corresponding semiconductor material and/or the diffusion behavior of standard dopants in the drain and source regions may be affected, which may result in a significantly increased junction leakage, which in turn may result in an effective mechanism for discharging unwanted charge carriers. Consequently, variations of the body potential may be significantly reduced, thereby extending the performance characteristics of SOI transistors with respect to voltage and temperature dependencies. Moreover, in other illustrative embodiments, the increased leakage of the respective junctions may be advantageously used in memory cell applications, in which hysteresis and thus a shift in the body potential may result in a corresponding operation-dependent variation of the threshold voltage, thereby possibly leading to significant instabilities for programming the respective memory cell. Due to the significant increase of the junction leakage, threshold variations may be significantly reduced, thereby improving and stabilizing the write ability of the respective memory cell. Consequently, the SOI architecture may be efficiently used for static RAM areas, wherein a reduction in size of the respective transistor area may be achieved, since a corresponding process margin of transistor widths may be significantly reduced, as is previously explained.

According to one illustrative embodiment of the present invention, a method comprises providing a non-doping atomic species in a drain and source area and at least partially in a body area of a first SOI transistor formed above a substrate. The method further comprises forming drain and source regions in the drain and source areas by implanting one or more dopant species. Finally, the drain and source regions are annealed to substantially re-crystallize implantation-induced crystal damage in the drain and source regions, wherein the non-doping atomic species provides an increased leakage path from the body area into the drain and source regions.

According to another illustrative embodiment of the present invention, a method comprises implanting at least one of carbon and fluorine into a portion of a body region and drain and source regions of a first SOI transistor. Furthermore, an annealing process is performed to activate dopants in the drain and source regions.

According to yet another illustrative embodiment of the present invention, a semiconductor device comprises a substrate including a first SOI region. A first transistor is formed in the first SOI region, wherein the first transistor comprises a drain region, a source region, a body region and leakage regions. Each leakage region comprises at least one of carbon and fluorine and extends from one of the drain region and the source region into the body region.

BRIEF DESCRIPTION OF THE DRAWINGS

The invention may be understood by reference to the following description taken in conjunction with the accompanying drawings, in which like reference numerals identify like elements, and in which:

FIGS. 2a-2d schematically illustrate cross-sectional views of a semiconductor device during various manufacturing stages, wherein SOI transistors of different leakage characteristics are formed in different device regions, for instance a logic region and a static RAM area, according to illustrative embodiments of the present invention.

Figure 1A:
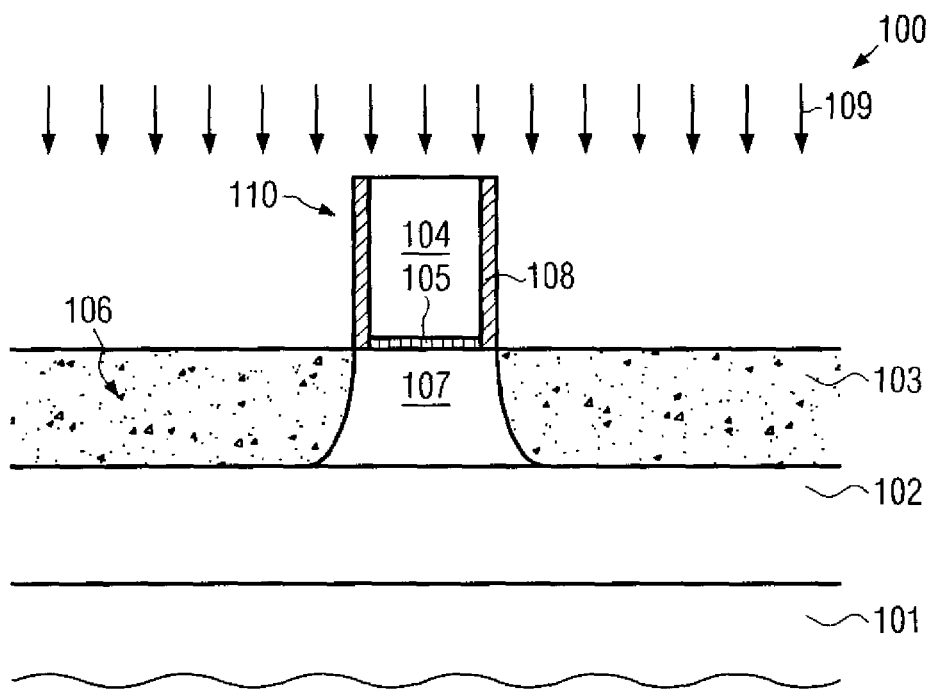
FIGS. 1a-1e schematically illustrate cross-sectional views of a semiconductor device comprising an SOI transistor having an additional light atomic species for modifying the band gap and/or diffusion behavior according to some illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for forming SOI transistors having an enhanced mechanism for removing unwanted charge carriers from the body region in order to reduce the floating body effect and the corresponding negative effects associated therewith, such as threshold variation, which may significantly restrict the minimum transistor dimensions in RAM areas of advanced semiconductor devices, since a significant mismatch of the threshold voltage may result in respective instabilities in writing a bit into the respective memory cell. As previously explained, in sophisticated SOI transistors, the body region, i.e., the area formed between the drain and source regions, is electrically insulated in the vertical direction by the buried insulating layer so that corresponding minority charge carriers, which may be generated by impact ionization and the like, may accumulate in the body region, thereby significantly altering the corresponding threshold voltage, i.e., the voltage at which a conductive channel starts to form in the body region. Consequently, unless additional so-called body ties are provided, the accumulated charge carriers may be discharged across the respective drain and source regions and, hence, conventionally, respective dislocation defects are generated in the vicinity of the PN junctions in order to increase their leakage currents, i.e., the reverse diode currents, which may then allow discharge, at least to a certain degree, of the accumulated minority charge carriers. Although this mechanism is highly efficient, in particular for logic blocks in an integrated circuit, an enhanced mechanism for discharging charge carriers from the body region may be desirable in order to more efficiently reduce hysteresis effects. For example, in static RAM areas of microprocessors or any other integrated circuits having extended memory areas, a moderately stable threshold voltage (Vt) is an important factor for stable operation of respective RAM bit cells. Consequently, in some conventional approaches, significant variation of the threshold voltage may be accounted for by respectively dimensioning the transistor width so as to have sufficient current drive capability margins for accommodating the threshold voltage variations. According to the present invention, the floating body effect and thus the threshold voltage variation may be significantly reduced, without substantially negatively affecting any other performance characteristics of the SOI transistor, by appropriately providing a light atomic species, such as carbon or fluorine, which may not significantly alter the doping characteristics and which may also be referred to as a non-doping species, in order to efficiently modify the junction leakage, i.e., to significantly increase the junction leakage, which directly translates into a respective increased stabilization of the threshold voltage. Consequently, for otherwise identical transistor parameters, a significant improvement with respect to voltage and temperature dependence may be achieved, since many advanced SOI devices are specifically designed for specified operating conditions due to the voltage and temperature dependence of the floating body effect. In other cases, specific device areas, such as SRAM areas, may receive SOI transistors having the improved leakage behavior in order to enhance threshold voltage stability, thereby providing the potential for significantly reducing the overall transistor dimensions, while other device areas, such as logic blocks, may be formed on the basis of conventional techniques, thereby not unduly increasing static leakage currents in these areas.

With reference to FIGS. 1a-1e and 2a-2d, further illustrative embodiments of the present invention will now be described in more detail. FIG. 1a schematically illustrates a cross-sectional view of a semiconductor device 100 comprising an SOI transistor 110 at an early manufacturing stage. At this manufacturing stage, the SOI transistor 110 may comprise a gate electrode 104 formed on a gate insulation layer 105, which in turn is formed on a semiconductor layer 103. The semiconductor layer 103 may be comprised of any appropriate semiconductor material. In illustrative embodiments, the layer 103 is substantially comprised of silicon, since the vast majority of complex integrated circuits are presently and will be in the near future formed on the basis of silicon. It should be appreciated that the semiconductor layer 103 may comprise a certain amount of dopants in accordance with a specified concentration profile as required. Furthermore, a thickness of the semiconductor layer 103 may be appropriately selected in order to provide the desired device characteristics. For instance, the SOI transistor 110 may be designed as a partially depleted transistor, wherein a thickness of the semiconductor layer 103 is in the range of 10 to several tenths of nanometers. Furthermore, the semiconductor layer 103 may have device-specific characteristics with respect to crystallographic orientation, strain and the like. For instance, if the transistor 110 represents a silicon-based transistor, the layer 103 may be provided as a strained silicon layer in order to enhance charge carrier mobility. The layer 103 may be formed according to typical SOI configuration on a respective buried insulating layer 102, which may be comprised of any appropriate material such as silicon dioxide, silicon nitride and the like. Furthermore, a substrate 101, such as a silicon substrate or any other appropriate carrier material, may be provided to support the layers 102 and 103.

In this manufacturing stage, adjacent to the gate electrode 104, respective drain and source areas 106 may be defined by respective isolation structures (not shown) and by the gate electrode 104, wherein respective drain and source regions are to be formed in the respective areas 106. Furthermore, a body region 107, which is substantially positioned below the gate electrode 104, is defined in the layer 103, wherein it should be appreciated that the dimensions of the drain and source areas 106, as well as the body region 107, may be defined by later manufacturing processes, when actual drain and source regions are formed on the basis of respective implantation processes and anneal cycles, as will be described later on. The body region 107 may thus represent the semiconductor region in the layer 103 positioned between the drain and source regions still to be formed and defining respective PN junctions therewith. Thus, the body region is inversely doped relative to the drain and source regions, while a conductive channel may form in the body region upon application of an appropriate control voltage on the gate electrode 104 during operation of the transistor 100.

Moreover, in one illustrative embodiment, the gate electrode 104 may have formed thereon offset spacer elements 108, for instance comprised of silicon dioxide, to provide a required offset for an ion implantation process 109, which may be designed to substantially amorphize the drain and source areas 106 in order to create, in a later re-crystallization process, respective crystalline defects in the body region 107 and in the drain and source regions still to be formed for creating effective leakage paths of the respective PN junctions, as is previously explained. Typically, the implantation process 109 is referred to as a pre-amorphization implant process, wherein typically a heavy ion species is used in order to create significant crystalline damage at moderate implantation doses. For example xenon, germanium and the like may be used on the basis of well-established implantation recipes in order to substantially amorphize the drain and source areas 106. It should be appreciated that, in other illustrative embodiments, the pre-amorphization implantation 109 may be performed in a later stage, as will be described with reference to FIGS. 2a-2d.

The semiconductor device 100 as shown in FIG. 1a may be formed in accordance with the following processes. After providing the substrate 101 having formed thereon the buried insulating layer 102 and the semiconductor layer 103, appropriate isolation structures, such as shallow trench isolations, may be formed on the basis of well-established techniques to provide a plurality of electrically insulated SOI regions. Thereafter or prior to the formation of the isolation trenches, implantation processes may be performed, if required, in order to establish a respective vertical dopant profile within the semiconductor layer 103. Next, insulating material for the gate insulation layer 105 may be formed, for instance by oxidation and/or deposition, followed by the deposition of an appropriate gate electrode material, such as polysilicon, doped or undoped, which may be accomplished on the basis of well-established low pressure chemical vapor deposition processes. Thereafter, the material layers may be patterned on the basis of photolithography and sophisticated etch techniques to obtain the gate electrode 104 and the gate insulation layer 105. Next, the offset spacers 108 may be formed by conformally depositing an appropriate material, such as silicon dioxide, silicon nitride and the like. If required, horizontal portions of the material may be removed by anisotropic etch techniques in order to form the spacers 108 as shown. In some illustrative embodiments, a width of the offset spacers 108 may be selected in accordance with requirements as demanded by an implantation process for forming drain and source extension regions, wherein a corresponding implantation process may be performed prior to the pre-amorphization process 109 or after the process 109. It should be appreciated that the pre-amorphization implant process 109, when requiring an increased offset to the gate electrode 104, may be performed at a later stage on the basis of other sidewall spacers that may be used for laterally profiling the drain and source regions still to be formed. In the embodiment shown, the pre-amorphization implantation process 109 may be performed on the basis of the spacers 108 so as to substantially amorphize the drain and source areas 106 down to a depth that may even extend to the buried insulating layer 102. In this case, a subsequent re-growth of the amorphized portions 106 may take place on the basis of the crystalline template provided by the body region 107.

Figure 1B:
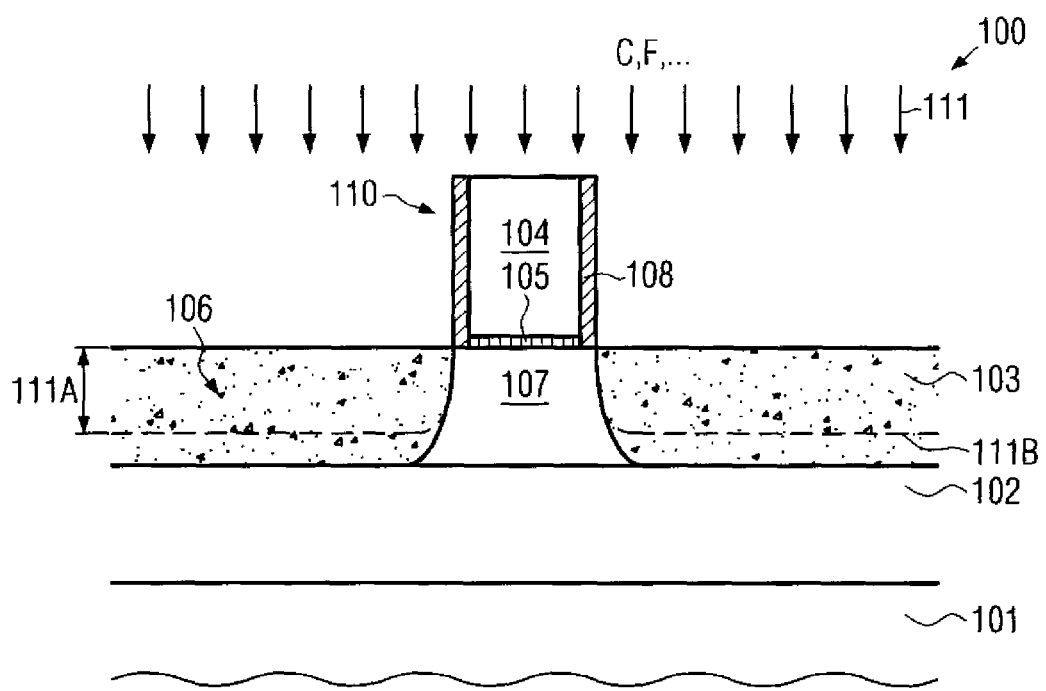

FIG. 1b schematically illustrates the semiconductor device 100 during a further implantation process 111 during which a light atomic species 111B, such as carbon, fluorine and the like, may be introduced into the layer 103 with an appropriate concentration and down to a specified depth 111A so as to ensure the presence of the light atomic species in the drain and source regions still to be formed as well as in a portion of the body region 107. For example, carbon may be implanted on the basis of specified process parameters, wherein respective implantation dose and energy values may readily be established on the basis of simulation calculations in order to obtain a desired concentration at the specified depth 111A. For example, a concentration of carbon atoms centered around the depth 111A may range from approximately $1 \times 10^{19}$-$1 \times 10^{20}$ atoms/cm$^3$. Similar values may also be valid for fluorine. In other illustrative embodiments, when a moderately low concentration of approximately 1-5×10$^{19}$ atoms/cm$^3$ is considered appropriate, the implantation process 111 may be performed in an earlier manufacturing stage, for instance prior to forming the gate electrode 104, thereby also providing the light atomic species, such as carbon and fluorine, throughout the body region 107. For instance, when forming a required vertical dopant profile in the semiconductor layer 103, the implantation process 111 may be incorporated in the respective implantation cycle in order to provide the desired carbon or fluorine concentration. In other illustrative embodiments, the respective light atomic species may be incorporated during an epitaxial growth process, when the layer 103 or a portion thereof may be formed on the basis of epitaxial growth techniques, in which a corresponding amount of carbon, fluorine and the like may be incorporated during a specific phase of the epitaxial growth process.

Figure 1C:
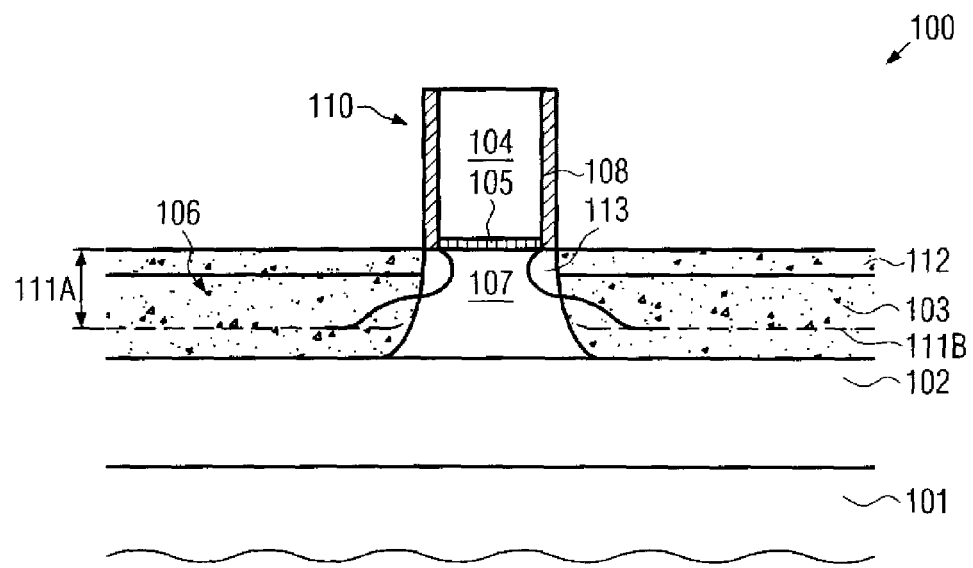

FIG. 1c schematically illustrates the semiconductor device 100 in a further advanced manufacturing stage. Here, the device 100 may comprise respective drain and source extension regions 112, which may be defined by an appropriately high dopant concentration in which an N-type dopant or a P-type dopant, depending on the type of transistor represented by the transistor 110, is introduced to a specified depth in accordance with device requirements. As previously explained, the drain and source extension regions 112 may, in other illustrative embodiments, be formed prior to the pre-amorphization implantation 109 and may, in some embodiments, also be formed prior to the implantation process 111 for introducing the light atomic species 111B. A corresponding process flow may be advantageous in cases when an increased offset of the substantially amorphized areas 106 with respect to the gate electrode 104, i.e., with respect to a channel region immediately located below the gate insulation layer 105, may be required. On the other hand, forming the extension regions 112 on the basis of the pre-amorphized areas 106 may reduce any channeling effects during a corresponding implantation process for forming the regions 112, thereby providing increased accuracy in positioning the regions 112.

Moreover, in some illustrative embodiments, so-called halo regions 113 may be formed on the basis of a corresponding implantation process. The halo region 113 may comprise an increased dopant concentration of the same conductivity type as the remaining body region 117 so as to provide a more efficiently graded dopant gradient of PN junctions formed between the extension regions 112, which are inversely doped with respect to the body region 107 and the halo region 113, and deep drain and source regions still to be formed. The halo regions 113 may be formed on the basis of well-established implantation recipes, which may also include a tilted implantation to provide the increased dopant concentration well below the gate electrode 104. It should be appreciated that, in some illustrative embodiments, the implantation process 111 for introducing the light atomic species 111B may be performed after the respective implantation processes for defining the halo regions 113 and the extension regions 112. For instance, the implantation process 111 may be performed after the halo implantation on the basis of a different sidewall spacer element, thereby providing enhanced flexibility in designing the lateral profile of the concentration of light atomic species 111B. For instance, if a reduced overlap with the body region 107 is desired, a corresponding spacer element of increased thickness may be provided prior to the implantation 111, thereby obtaining an increased offset with respect to the gate electrode 104. The light atomic species 111B may also be referred to as a non-doping species since the corresponding atoms may act as charge carrier traps and/or diffusion modifiers rather than as acceptors or donators, as is the case for standard dopant species, which may correspondingly shift Fermi levels within the respective band gap.

Figure 1D:
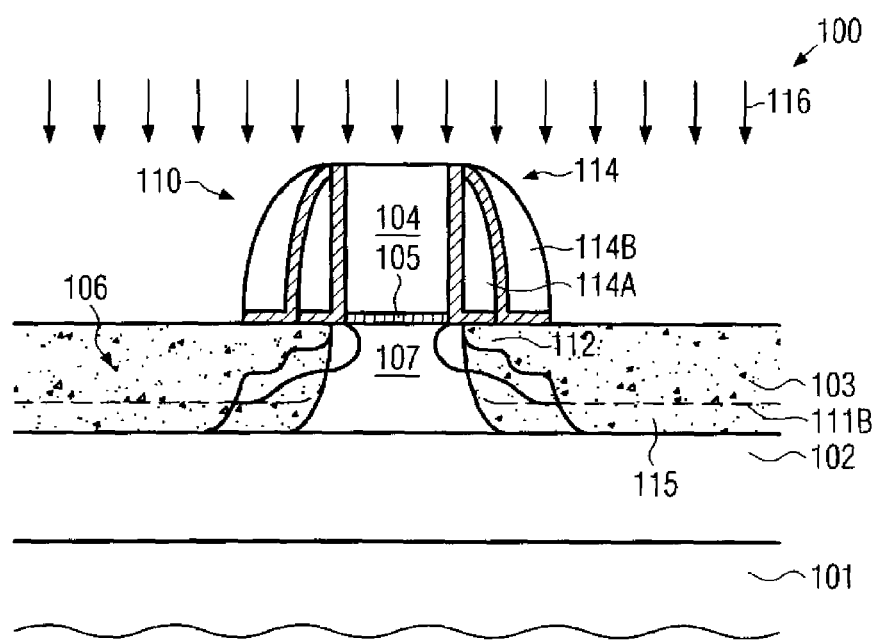

FIG. 1d schematically illustrates the semiconductor device 100 in a further advanced manufacturing stage. The transistor 110 may comprise in this stage a sidewall spacer structure 114 formed on sidewalls of the gate electrode 104, wherein the spacer structure 114 may comprise one or more individual spacer elements such as the spacers 114A, 114B, possibly including additional etch stop liners, wherein a width of the spacer structure 114 is defined on the basis of design criteria with respect to the lateral profiling of deep drain and source regions 115, which may be formed on the basis of an implantation process 116. It should be appreciated that the process 116 may include a plurality of implantation steps wherein the first spacer element 114A may be formed and subsequently a first implantation step may be carried out, and subsequently the second spacer element 114B may be formed followed by a second implantation step. In other illustrative embodiments, more spacer elements or a single spacer element may be appropriate for creating the respective lateral and vertical dopant concentration for the deep drain and source regions 115.

The spacer structure 114 may be formed on the basis of well-established recipes including the deposition of an appropriate spacer material, such as silicon nitride, silicon dioxide and the like, wherein, if required, prior to the spacer material, the respective liner material may be formed, and subsequently an anisotropic etch process may be performed to obtain the individual spacer elements of the structure 114. During the respective process sequence, the deposition and etch parameters may be appropriately selected so as to obtain the required spacer width and thus masking effect during the one or more implantation steps of the process 116. After the completion of the implantation process 116, an appropriate anneal process may be performed in order to activate the dopant species defining the extension regions 112 and the deep drain and source regions 115, as well as the halo regions 113 and the light atomic species 111B. Moreover, during the respective anneal process, the substantially amorphized areas 106 may be substantially re-crystallized, while during the re-crystallization process, respective dislocation defects may be created in the vicinity of the boundary between the crystalline and the substantially amorphized regions. Moreover, depending on the characteristics of the anneal procedure, a certain degree of diffusion of the dopants and of the non-doping atomic species 111B may take place, wherein the presence of the species 111B may, to a certain degree, modify the diffusivity of the dopants which may result in a reduced out-diffusion of the dopants, thereby providing more pronounced dopant gradients at the PN junctions. In some illustrative embodiments, highly advanced anneal techniques may be used, such as flash anneal or laser anneal techniques, in which pulses of short duration of energetic radiation are directed to exposed surface portions in order to heat the corresponding surfaces in a highly localized manner, thereby initiating an efficient activation of dopants, wherein the degree of diffusion is significantly reduced due to the short duration of the respective radiation pulses. On the other hand, an efficient re-crystallization may be performed on the basis of a heat treatment with temperatures in the range of approximately 600-800° C. at which dopant diffusion may be significantly reduced, while the crystalline structure is substantially reconfigured.

Figure 1E:
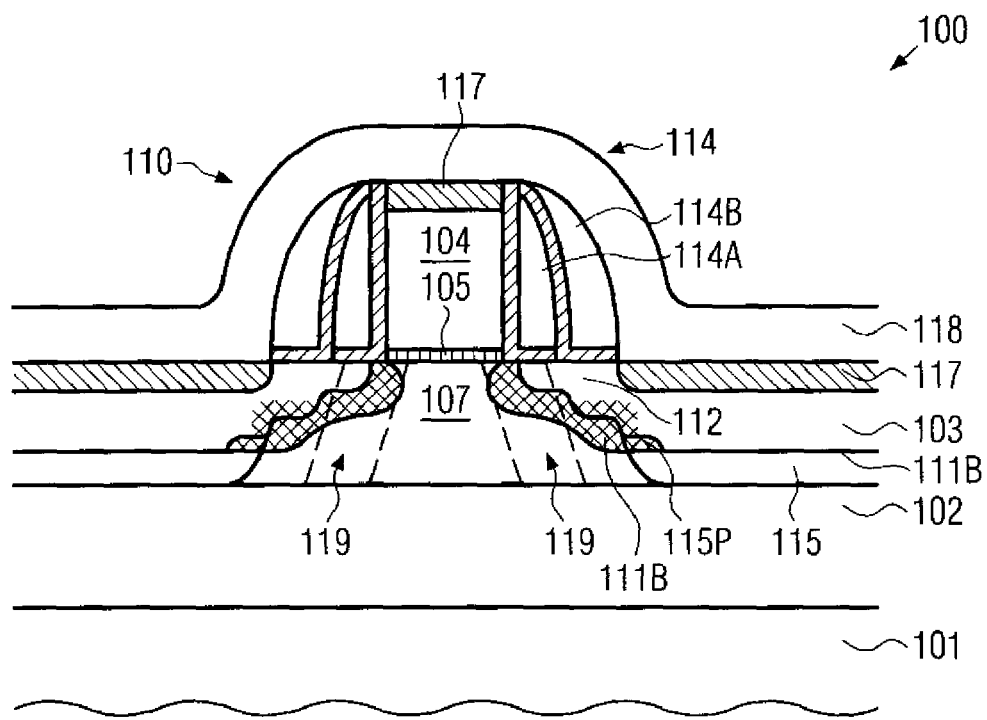

FIG. 1e schematically illustrates the semiconductor device 100 in a further advanced manufacturing stage. After the completion of the above-described anneal process, the device 100 comprises respective areas 119 of increased dislocation defects, which may extend from the body region 107 into the extension regions 112 and/or the deep drain and source regions 115, depending on the lateral profiling thereof, thereby providing an increased leakage path for charge carriers accumulating in the body region 107, as is previously explained. Moreover, at least a portion of the regions 119 may include the non-doping light atomic species 111B, thereby enhancing the junction leakage, as is previously discussed. Moreover, as previously described with reference to FIG. 1d, when conventional anneal processes have been used, the respective PN junctions 115P may have a more pronounced, i.e., abrupt, concentration profile due to the modified diffusion behavior caused by the presence of the non-doping light atomic species 111B. As a consequence, during operation of the transistor 110, the amount of minority charge carriers, i.e., holes for an N-channel transistor and electrons for a P-channel transistor, accumulating in the body region 107 may be significantly reduced due to the increased leakage rate provided by the regions 119 including the non-doping light atomic species 111B.

Moreover, the device 100 may further comprise respective metal silicide regions 117 formed in the drain and source regions 115 and in the gate electrode 104 in order to reduce contact and sheet resistance of these areas. For example, the regions 117 may comprise nickel, platinum, cobalt or combinations thereof in the form of respective metal silicides. Additionally, the semiconductor device 100 may have formed thereon a respective stressed dielectric layer 118, which may be comprised of any appropriate material, such as silicon nitride, which may be provided with high intrinsic stress in the range of approximately 2.0 GPa (Giga Pascal) of compressive or tensile stress, thereby also imparting a high amount of strain to the body region 107, thereby increasing the charge carrier mobility of holes and electrons when providing compressive and tensile stress, respectively. It should be appreciated that the stressed dielectric layer 118 may be provided with different intrinsic stress for different types of transistors 110 formed on the semiconductor device 100. For example, when representing a P-channel transistor, the layer 118 may be provided with high compressive stress, while a high tensile stress may be applied when the transistor 110 represents an N-channel transistor. Irrespective of the type of transistor, the non-doping light atomic species 111B may be provided as explained above in order to increase a junction leakage, thereby significantly reducing the floating body effect for both types of transistors.

With reference to FIGS. 2a-2d, further illustrative embodiments of the present invention will now be described in more detail, in which SOI transistors with increased junction leakage according to the provision of a non-doping light atomic species may be provided in a locally selective manner so as to significantly enhance device performance of a semiconductor device as a whole.

FIG. 2a schematically illustrates a semiconductor device 200 including a first device region 250L and a second device region 250M, wherein both regions 250L, 250M represent regions having an SOI architecture. That is, the semiconductor device 200 may comprise a substrate 201, such as a silicon substrate or any other appropriate carrier material, having formed thereon a buried insulating layer 202, such as a silicon dioxide layer and the like, on which is provided a semiconductor layer 203. In both device regions 250L, 250M, a plurality of SOI regions may be defined on the basis of respective isolation structures 230. The respective SOI regions may correspond to transistor elements 210L and 220L in the first device region 250L, while first transistors 210M and second transistors 220M may be provided in the second device region 250M. For example, the transistors 210L, 210M may represent N-channel transistors while the transistors 220L, 220M may represent P-channel transistors. It should be appreciated, however, that the transistors 210L, 220L in the first device region 250L may represent any type of transistors, which may receive a different type of treatment with respect to PN junction engineering or any other transistor-specific characteristics. The same holds true for the transistors 210M, 220M in the second device region 250M. In the following, it may be assumed that the second device region 250M, which may represent a memory area such as a static RAM area of a microprocessor and the like, may receive PN junctions with increased leakage in order to provide a significantly reduced floating body potential fluctuation and thus a reduced threshold voltage variation. On the other hand, the device region 250L may represent a device area, such as a logic functional block, in which the requirements for threshold voltage stability are less pronounced, whereas a reduced junction leakage may provide an overall enhanced performance of the device 200, since the static power consumption may be maintained at a moderately low level in the first device region 250L.

The transistors 210L, 220L, 210M, 220M in the first and second device regions 250L, 250M may have substantially the same configuration as the transistor 110 as described with reference to FIGS. 1a-1e. In illustrative embodiments, the transistors 210, 220 may have in this manufacturing stage a gate electrode 204 and a sidewall spacer structure 214 formed thereon. Moreover, in respective drain and source areas 206, extension regions (not shown) may still have been formed on the basis of a respective offset spacer structure (not shown), as is also described with reference to FIGS. 1a-1c. Moreover, a body region 207 may be located between the respective drain and source areas 206. Moreover, the device 200 may be subjected to a pre-amorphization implantation process 209, wherein, in the illustrative embodiments shown in FIGS. 2a-2d, the respective implantation process 209 is selectively performed on specified transistor types, such as the transistors 210L and 210M, while other transistors such as the transistors 220L and 220M may be covered by a corresponding resist mask 231. A corresponding process strategy may be advantageous when the profiling of the respective drain and source regions in the areas 206 may have to be performed differently for the different types of transistors, for instance due to the different type of dopants to be used and the like. For example, boron may frequently be used as a P-type dopant for P-channel transistors which may have a significantly different diffusion behavior compared to N-type dopants, such as arsenic, thereby possibly requiring a different implantation and amorphization strategy. In other illustrative embodiments, the pre-amorphization implantation 209 may be performed commonly for all transistors within the first device region 250L or may be commonly performed for all transistor elements in the second device region 250M, or may be performed commonly for all transistor elements of the device 200. As previously explained, the pre-amorphization implantation 209 may be performed prior to the formation of the spacer structure 214, as is for instance discussed with reference to FIGS. 1a-1e, while in this embodiment an increased offset of the amorphous region from the corresponding gate electrodes 204 is achieved. Consequently, corresponding dislocation defects of the transistor may be offset from the respective channel regions. For example, the implantation 209 may be performed on the basis of xenon, germanium or any other heavy ions, wherein respective implantation parameters for achieving the required amorphization effect down to a desired depth may be readily established on the basis of simulation calculations and/or respective experiments. Consequently, a desired degree of amorphization is obtained within the drain and source areas 206 in the transistors 210L, 210M.

FIG. 2b schematically illustrates the semiconductor device 200 with a further implantation mask 232 in the first region 250L while exposing at least a portion of the second region 250M, that is, the transistor 210M. Moreover, the device 200 is exposed to an implantation process 211 for introducing light atomic species, wherein, in one illustrative embodiment, carbon may be used as the light atomic species in order to correspondingly modify the junction leakage during the formation of respective PN junctions. Regarding the specifics of the implantation process 211, the same criteria apply as previously explained with reference to the process 111. That is, appropriate implantation parameters, such as dose and energy, may be readily established on the basis of the device-specific requirements by means of simulation and/or experimentation. Consequently, the corresponding light atomic species, such as carbon, may be introduced with a required concentration down to a specific depth in order to obtain the desired increase of leakage current for respective PN junctions, as is previously explained. For example, the process 211 may be designed to position the respective atomic species within the entire depth of the semiconductor layer 203 or the maximum concentration may be positioned at any required depth, as is for instance shown and discussed with reference to FIG. 1b.

FIG. 2c schematically illustrates the device 200 during a further implantation process 216 on the basis of an appropriate resist mask 233, which may expose the transistors 210L, 210M while covering the transistors 220L, 220M. During the implantation 216, the respective dopant species for the deep drain and source regions may be implanted into the areas 206 on the basis of well-established implantation recipes. It should be appreciated that a corresponding process sequence as shown in FIGS. 2a-2c may have already been performed for the transistors 220L, 220M when the respective processes have to be individually adapted to the respective transistor types. In still other embodiments, as previously discussed, the respective processes shown in FIGS. 2a-2b may be performed simultaneously for each transistor type in the respective device regions 250L, 250M, that is, the transistors 210L, 220L in the region 250L may be covered by the resist mask 232, while all of the transistors 210M, 220M may be exposed to the implantation process 211 in order to commonly provide therein the respective light atomic species, when the corresponding implantation parameters may be appropriate for both types of transistors. Similar considerations may also hold true for the amorphization implantation 209. Thereby, the drain and source implantation 216 may be performed on the basis of the mask 233 to provide the appropriate dopant species for the respective type of transistors.

In other illustrative embodiments, the sequence as previously described may be repeated for the transistors 220L, 220M after completion of the process 216, wherein the respective transistors 210L, 210M may be covered by respective implantation masks. Irrespective of the process strategy used, after forming respective drain and source regions in all of the transistors 210L, 220L, 210M, 220M, an appropriate anneal process may be performed to re-crystallize amorphized portions and activate respective dopants in the transistors.

FIG. 2d schematically illustrates the device 200 after the completion of the respective anneal process, wherein, for convenience, respective dislocation defect regions 219 stemming from the pre-amorphization implantation 209 are shown in the transistors 210L, 210M only. Moreover, due to the additional incorporation of the light atomic species, such as carbon, the respective defect regions 219A in the transistors 210M including at least partially the additional atomic species may provide significantly enhanced junction leakages compared to the respective defect regions 219 in the transistor 210L. Consequently, the respective transistors 210M may exhibit a significantly reduced threshold variation, thereby making these transistors appropriate for static RAM areas, in which a high degree of threshold voltage matching is required. Thus, a high degree of compatibility with conventional SOI strategies for advanced semiconductor devices may be maintained while nevertheless a significant enhancement in production yield may be achieved due to the reduced floating body effects in sensitive device areas, such as the region 250M. Moreover, transistor dimensions in the region 250M, i.e., the dimensions in the respective transistor width directions, may be reduced compared to conventional devices providing substantially the same performance, since the drive current margins may be reduced due to the decreased hysteresis effect of the transistors 210M in the device region 250M. It should further be appreciated that, although not shown in FIG. 2d, the corresponding technique for increasing the leakage currents may be applied to the transistors 220M. Furthermore, the selective increase of leakage currents by incorporating a light atomic species may be performed on the basis of the same process strategies as previously described with reference to FIGS. 1a-1e. That is, the incorporation of the light atomic species may be performed at a different phase compared to what is shown in FIGS. 2a-2d. For example, the light atomic species may be introduced into the semiconductor layer 203 at an early manufacturing stage, possibly prior to the formation of the gate electrode 204. Hereby, implantation techniques, epitaxial growth techniques and the like may be used. In other cases, the light atomic species may be incorporated by the process 211 prior to the formation of the sidewall spacer structure 214, as is also described with reference to FIGS. 1a-1e.

As a result, the present invention provides an enhanced technique for reducing the floating body effect in advanced SOI transistors in that an additional light atomic species is incorporated in a portion of the drain and source regions and the body region in order to increase the corresponding junction leakage. The light atomic species, which in illustrative embodiments comprises carbon or fluorine, may be incorporated at any appropriate manufacturing stage by a respective implantation process or by any other techniques, such as epitaxial growth and the like, wherein the respective process parameters may be controlled so as to obtain the required increase of junction leakage. In some illustrative embodiments, the corresponding increase of junction leakage may be selectively provided in a semiconductor device, wherein, for instance in device areas that are highly sensitive to threshold voltage variations, a significant reduction of body potential fluctuations may be achieved, while in other less sensitive device areas a moderately low static leakage current may be maintained. In this way, a significant improvement of the overall performance as well as the production yield may be achieved, while a high degree of compatibility with conventional techniques may be maintained. Furthermore, presently existing device designs for advanced SOI devices have an enhanced performance with respect to their applicability under different voltage and/or temperature conditions due to a significant reduction of the floating body effect.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    providing a non-doping atomic species in a drain and source area and at least partially in a body area of a first SOI transistor formed above a substrate;
    forming drain and source regions in said drain and source areas by implanting one or more dopant species, wherein forming said drain and source regions comprises:
        prior to implanting said one or more dopant species, performing a pre-amorphization implantation process for substantially amorphizing at least said drain and source areas; and
        performing a halo implantation process after performing said pre-amorphization implantation process, wherein said non-doping atomic species is provided after said pre-amorphization process and prior to said halo implantation process; and
    annealing said drain and source regions to substantially re crystallize implantation-induced crystal damage in said drain and source regions, said non-doping atomic species providing an increased leakage path from said body area into said drain and source regions.

2. The method of claim 1, wherein said non-doping atomic species comprises at least one of carbon and fluorine.

3. The method of claim 1, wherein said atomic species is provided by implanting said non-doping atomic species.

4. The method of claim 1, further comprising masking a second SOI transistor formed above said substrate prior to providing said non-doping atomic species in said first SOI transistor to substantially avoid introduction of said non-doping atomic species into said second SOI transistor.

5. The method of claim 4, wherein said first SOI transistor is a portion of a memory cell.

6. The method of claim 4, wherein said second SOI transistor is a part of a logic circuitry and said first SOI transistor is a part of a memory circuit.

7. The method of claim 1, wherein an least implantation depth of said non-doping atomic species is less than an implantation depth of said drain and source regions.

* * * * *

UNITED STATES PATENT AND TRADEMARK OFFICE
CERTIFICATE OF CORRECTION

| | | |
|---|---|---|
| PATENT NO. | : 7,863,171 B2 | Page 1 of 1 |
| APPLICATION NO. | : 11/609995 | |
| DATED | : January 4, 2011 | |
| INVENTOR(S) | : Jan Hoentschel et al. | |

It is certified that error appears in the above-identified patent and that said Letters Patent is hereby corrected as shown below:

Col. 14, line 43, delete "least".

Signed and Sealed this
Eighth Day of February, 2011

David J. Kappos
*Director of the United States Patent and Trademark Office*